United States Patent [19]

Braun et al.

[11] Patent Number: 4,510,446

[45] Date of Patent: Apr. 9, 1985

[54] TEST COUPONS FOR DETERMINING THE REGISTRATION OF SUBSURFACE LAYERS IN A MULTILAYER PRINTED CIRCUIT BOARD

[75] Inventors: Robert E. Braun, Norristown; John E. Benasutti, North Wales, both of Pa.

[73] Assignee: Burroughs Corporation, Detroit, Mich.

[21] Appl. No.: 438,768

[22] Filed: Nov. 3, 1982

[51] Int. Cl.³ ............................................. G01R 31/22
[52] U.S. Cl. ................................. 324/158 R; 324/51; 324/73 PC; 324/65 R
[58] Field of Search ................... 324/51, 73 PC, 65 R, 324/62, 158 R

[56] References Cited

U.S. PATENT DOCUMENTS 3,517,144 6/1970 Arsenault et al. ........... 324/158 R X
3,859,711 1/1975 McKiddy .................... 324/73 PC X
4,432,037 2/1984 Brabetz ...................... 324/73 PC X
4,443,756 4/1984 Lightbody et al. ............ 324/73 PC Primary Examiner—Stanley T. Krawczewicz
Attorney, Agent, or Firm—Francis A. Varallo; Mervyn L. Young; K. R. Peterson

[57] ABSTRACT

The present disclosure describes test coupons having predetermined respective test patterns, formed in a multilayer printed circuit board simultaneously with the fabrication of the latter. The test coupons are probed with conventional electrical instruments to provide information as to the occurrence of a misregistration of any given subsurface printed plane or trace, whether or not the misregistration exceeds a specified limit, and if desired, a measure of the degree of misregistration. The foregoing are readily accomplished in a time and cost efficient manner without the need for cross-sectioning portions of the board and the visual observation of the subsurface printed layers.

5 Claims, 4 Drawing Figures

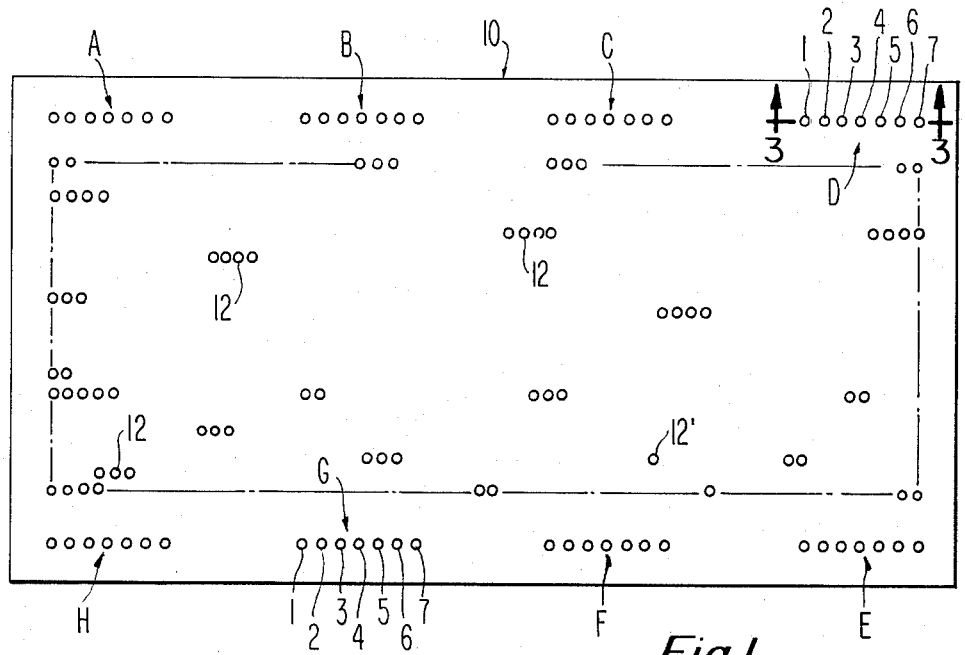
Fig.1
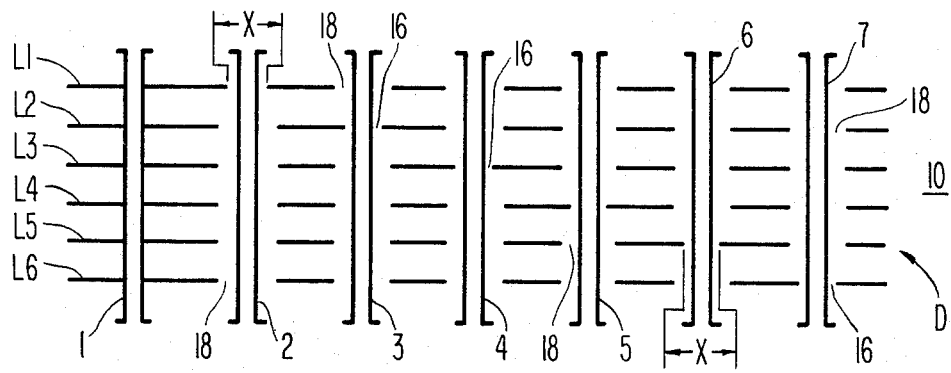
Fig.3
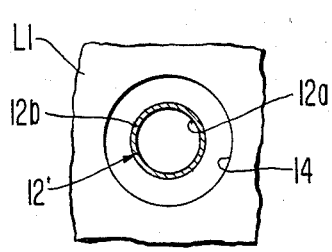
Fig.2
Fig.4
| DIM. TABLE | |
|---|---|
| COUPON | "X" DIA. |
| A & E | .065 |
| B & F | .070 |
| C & G | .075 |
| D & H | .080 |

TEST COUPONS FOR DETERMINING THE REGISTRATION OF SUBSURFACE LAYERS IN A MULTILAYER PRINTED CIRCUIT BOARD

BACKGROUND OF THE INVENTION

The high packaging density of present day electronic equipment has made necessary the use of multilayer printed circuit boards. The latter, in addition to the layers on the opposite external surfaces thereof, are comprised of additional subsurface layers, which normally take the form of copper planes or traces imbedded in the board insulating substrate material.

The manufacture of multilayer printed circuit boards dictates the requirement for proper registration of the layers. More specifically, plated-through holes in a multilayer printed circuit board are required to be either electrically connected to or insulated from the internal planes or traces, in accordance with the electronic design implemented within the board. Misregistration, such as the shifting of one or more of the internal layers relative to the plated-through holes, may result in circuit shorts, opens or current leakage because of low resistance paths in the insulating substrate material. Such misregistration of the internal layers can be caused by a variety of factors, such as the shifting of the printed wiring artwork or inaccuracies in the latter, and thermal expansion or shrinkage during the laminating phase of board manufacture.

Test coupons are presently incorporated in printed circuit boards by the electronics industry to evaluate the quality of the printed wiring itself and its registration. These test coupons are placed in an isolated area of the printed wiring board and are adapted to be cross-sectioned. That is, the board is cut through with a fine-toothed saw and the internal traces are examined visually, usually with the aid of magnifying means. A visual determination may be made, for example, as to whether or not the specified amount of insulating material is present between a given trace and a standard via hole. It must be emphasized that this procedure is both time consuming and costly. Moreover, since misregistration of subsurface layers may occur in a random manner in any given manufacturing lot, it may be necessary to perform this cross-sectioning procedure on each and every board and in more than one area of the board to insure proper operation of the equipment in which they are ultimately placed.

What is desired is a test coupon arrangement which will provide an indication of the subsurface layer registrations without cross-sectioning the board and the time consuming visual examination of the traces; and which because of its simplicity, may be easily and swiftly performed on each and every board, and which may provide quantitative information on the degree of misregistration to enable corrective measures to be undertaken in the board manufacturing process. The present invention fills such a need.

SUMMARY OF THE INVENTION

In accordance with the present invention there is provided a test coupon arrangement involving at least one coupon but preferably a plurality of coupons, each having a plurality of test plated-through holes of specified predetermined relationship to the internal layers of the multilayer printed circuit board.

In the manufacture of a multilayer printed circuit board, the disposition of all of the active plated-through holes which are to receive terminals, is specified with respect to the surface and internal layers of the board. In this manner, signal and power interconnections are accomplished. For example, the plating on a given hole may be specified as being electrically connected to a first subsurface layer, such as a ground plane, but insulated from the remaining subsurface layers. The latter is effected by providing a void of prescribed diameter surrounding the given hole, in each of the last mentioned layers. Generally, a tolerance limit is placed on the position of the void relative to the plated hole, such that minor shifts in the registration thereof (that is, the hole is not centered in the void) are acceptable since no detrimental electrical effects will result. However, in the above example, an out-of-tolerance misregistration of a layer to which no electrical connection is desired, may cause either a short circuit or low resistance current path between the plated material of the given hole and that layer.

The test coupon organization contemplated by the present invention provides a means for checking the internal layer registrations without cutting the printed circuit board. At the time of board manufacture, one or preferably a plurality of test coupons are required to be located generally along the perimeter of the board. Each test coupon is specified as having a plurality of test plated-through holes—one more hole than the number of subsurface layers in the board. The plated material of one of the test holes in each coupon is specified as being electrically connected in common to all of the metallic planes or traces of the respective subsurface layers. Each successive plated-through hole in a coupon is insulated from a designated different subsurface layer by a specified diameter void in the electrically conductive material of the designated layer. The diameter of the last mentioned void is the same in any given coupon, and is selected to be less than that specified for the non-connected layers surrounding an active plated hole in the board. On the other hand, for the same plated-through hole in a given coupon, the remaining layers are specified to have an oversize void, that is, a larger diameter void than that specified for the non-connected layers adjacent the active holes. Since it is the relationship of the conductive material surrounding the coupon test hole to the material of a designated layer which is of interest, the oversize voids prevent spurious test results which might result from misregistrations of the other layers.

If a set of test coupons is utilized, quantitative information on the degree of misregistration may be derived therefrom. The size of the void in a designated layer surrounding an homologous test hole in the coupons is progressively varied. For example, the largest void may be used to detect a misregistration which would render the board unacceptable. Progressively smaller voids of specified diameter will indicate the degree of misregistration, which while acceptable, may be used to better control the board manufacturing process.

The actual testing is easily accomplished by using an appropriate resistance meter, which will indicate the value of resistance between the coupon test hole which is common to all of the subsurface layers and the test hole associated with a designated layer in each coupon. Since the size of the specified circular voids surrounding the coupon test holes is known, a zero resistance reading that is, a short circuit indicates that the designated layer has shifted an amount equal to the difference in the radii of the void and that of the plated-through test hole, including the plating thickness. Data obtained from like coupons placed at opposite extremities of the printed circuit board give additional information as to possible skewing or rotation of the designated layer at one extremity relative to the test hole serving as a reference at the other extremity. Other combinations of test coupons of the type envisioned by the present invention may be placed at strategic locations on the printed circuit board, and these will yield specific data useful in multilayer board construction.

Other features and advantages of the present invention will become apparent in the detailed description of the invention which follows.

BRIEF DESCRIPTION OF THE DRAWINGS

FIG. 1 is a plan view of a multilayer printed circuit board manufactured with a plurality of the test coupons of the present invention.

FIG. 2 is a plan view of an active plated-through hole in relation to a perfectly registered void in a subsurface layer of the board.

FIG. 3 is a section view taken along the lines 3—3 of one of the test coupons of FIG. 1.

FIG. 4 is a table designating for purposes of example, the dimensions of the voids specified for designated layers associated with the test holes in the respective test coupons of FIG. 1.

DESCRIPTION OF THE PREFERRED EMBODIMENT

FIG. 1 illustrates in simplified fashion, a plan view of a multilayer printed circuit board 10. A few of the multiplicity of active plated-through holes 12 are shown. Each of these holes is adapted to receive a terminal or pin (not shown), such as one of the well known "compliant" type. At the time of board manufacture, the disposition of each of the active holes 12 is specified as to its relationship to the surface or internal layers of the board 10. That is, a particular plated through hole may have its electrically conductive plating material connected to a first subsurface layer which functions as a ground plane; or a second active hole may have its conductive material connected to a second subsurface layer which contains conductive traces for carrying electrical power or signals.

Two sets of test coupons, namely a first set labeled A through D and a second set, E through H are disposed respectively along the board periphery, on opposite sides thereof. Each of the test coupons includes a plurality of test plated-through holes, 1–7 inclusive. The relationship of the plating material surrounding each test hole to the subsurface layers will be considered hereinafter in connection with FIG. 3.

It should be understood that while the foregoing arrangement represents an actual operative embodiment of the present invention, the details regarding the number of test coupons, their location on the printed circuit board, the dimensions of the plated-through active and test holes and those of the voids in the subsurface layers, have been included solely for purposes of example and are not to be considered limitative of the invention.

FIG. 2 is a greatly enlarged view of a single active plated-through hole 12', showing the hole itself 12a for receiving a terminal (not shown) and the plating material 12b. The latter surrounds the hole 12a and extends to the exterior surfaces of the board to form pads (not shown). The hole is approximately 0.040 inches in diameter, and the thickness of the plating material is 0.0025 inches. The relationship of the plated-through hole 12' to a subsurface layer L1 is shown. It is assumed that as specified at the time of manufacture, no electrical connection is desired between hole 12' and layer L1, and that in fact, hole 12' is to be located at the center of a circular 0.085 inch diameter void 14 formed in the copper etch of layer L1. During the manufacturing process, void 14 is filled with the electrically insulating material of which the board is formed. Thus, with perfect registration, the outer conductive surface of the plating material 12b of hole 12a is separated from the conductive material of layer L1 by a thickness of 0.020 inches of the board insulating material. FIG. 3 illustrates in cross section, one of the test coupons illustrated in FIG. 1, namely, coupon D. The test plated-through holes 1–7 inclusive are shown in relation to the six subsurface layers L1 through L6 inclusive of the printed circuit board 10. The diameter of each of the test holes and the thickness of their plating material are assumed to be the same as those of the active plated-through hole 12 described hereinbefore. The plated-through hole designated by the reference numeral 1, is shown electrically connected in common to all of the subsurface layers L1 through L6. The remaining test holes 2 through 7 of coupon D are associated respectively with layers L1 through L6. That is, during board manufacture each successive plated-through test hole in a coupon is insulated from a designated different subsurface layer by a specified diameter void in the electrically conductive material of the designated layer. As listed in the table of FIG. 4, the void 16 (dimension X) has a diameter of 0.080 inches in coupon D, and is the same for each test hole in the last mentioned coupon. In practice, this void is selected to have a smaller diameter than void 14 specified for the non-connected layers surrounding an active plated hole 12 in the board 10. On the other hand, for the same test hole in a given coupon, the remaining layers are specified to have an oversize void 18, for example 0.090 inches in diameter, rather than the 0.085 inches in diameter specified for the void 14 of the non-connected layers adjacent the active holes 12. The relationship of the plated test hole in the coupon to a designated layer is of interest, and the use of oversize voids 18 prevents spurious test results which might result from misregistrations in layers not associated with a particular coupon test hole. For example, test hole 2 of coupon D tests the registration of layer L1, and shifts in layers L2 through L6 must not influence the former.

A single test coupon as taught by the present invention may be used to obtain some, although rather limited, registration data. For example, consider the use of coupon D. An ohmmeter may be employed to measure the resistance between test hole 1, the hole common to all of the layers, and each successive test hole 2 through 7. A zero resistance measurement at any test hole indicates that the designated layer associated with that hole is misregistered by an amount equal to the difference in the radii of the void 16 specified for the given coupon (in accordance with FIG. 4) and that of the plated-through test hole, including the plating thickness. Thus, if the ohmmeter indicates that the conductive plating of test hole 2 (radius of a 0.0225 inches) in coupon D is in contact with the conductive material of layer L1 surrounding void 16 (radius of 0.040 inches), it is known that layer L1 has shifted 0.0175 inches. This means that the conductive material of layer L1 may be approximately 0.0025 inches from an active hole 12 on the board where no subsurface connection to layer L1 is desired, and this minimal insulation distance may be cause for rejection of the board. On the other hand, if no shorts are found in probing all of the test holes in coupon D, the board may be tentatively regarded as acceptable.

The word tentative is used, because misregistration may take different forms, all of which are not tested by a single coupon. In general, test coupons are used in pairs, and are placed at opposite ends or diagonal corners of a printed circuit board to provide a maximum board distance therebetween. The latter positioning provides a worst case registration condition. With reference to FIG. 1, coupons D and H may be utilized. Thus, if the misregistration of a layer takes the form of rotation about an axis which includes the set of test holes of coupon D (thereby providing no zero resistance for this coupon), a reading associated with the appropriate test hole of coupon H will indicate the misregistration of the layer.

If a set of test coupons such as coupons A through D are utilized as in FIG. 1, quantitative information on the misregistration of a layer will be obtained. As indicated in FIG. 4, the diameter of the voids 16 associated with designated layers L1 through L6 for the coupons A through D are 0.065, 0.070, 0.075, and 0.080 inches respectively. Since these voids are progressively larger, if no short circuits are detected by coupon D which has the largest diameter void, coupons C, B and A are then examined in turn. If, for example, a short is detected when probing test holes 3 of coupons B and A, but not in the homologous test holes of D and C, it may be concluded that a shift in registration has occurred in subsurface layer L2, and the shift is at least 0.0125 inches and less than 0.0150 inches. Accordingly, utilizing one set of coupons A through D of FIG. 1, or preferably both sets A through D and E through H for the reasons noted hereinbefore as to the advantages of probing spaced-apart pairs of coupons, a registration shift for each of the six internal layers L1 through L6 in steps of 0.0025 inches, from 0.010 to 0.0175 inches, may be determined.

It will be apparent from the foregoing description of the invention and its implementation that there is provided an improved means of detecting variations in the registration of the internal layers of a printed circuit board relative to the active plated-through holes disposed in the latter. It should be understood that modifications of the arrangement of the test coupons and their test plated-through holes may be required to fit particular printed circuit board designs. Such modifications will be apparent to those skilled in the art. The present invention is not considered limited to the embodiment chosen for purpose of disclosure, and covers all changes and modifications which do not constitute departures from the true spirit and scope of this invention. Accordingly, all such variations as are in accord with the principles discussed previously are meant to fall within the scope of the claims which follow.

What is claimed is:

1. A test arrangement for a multilayer printed circuit board for determining the registration of the electrically conductive subsurface layers thereof relative to a multiplicity of active plated-through holes wherein predetermined ones of said active holes are electrically connected to a desired layer and insulated from electrical contact with the other layers by voids in the latter, said test arrangement comprising:

at least one test coupon incorporated within said multilayer board at the time of its manufacture, said test coupon having a plurality of test plated-through holes, a first of said test holes being electrically connected in common to all of said subsurface layers of said printed circuit board, the remaining ones of said plurality of test holes being associated respectively with said subsurface layers, each of said last mentioned test holes being specified at the time of board manufacture as being centrally disposed with respect to a void of first predetermined size in its associated layer, and similarly disposed with respect to voids of second predetermined size in the remaining layers, the electrical circuit resistance present between said first of said test holes and a given one of the remaining test holes providing an indication of the registration of the layer associated with said given test hole.

2. A test arrangement as defined in claim 1 further characterized in that the voids in the layers surrounding said active and said test plated-through holes are all circular in form, and that both said active and said test plated-through holes are circular in cross-section.

3. A test arrangement as defined in claim 2 further characterized in that the voids surrounding the active plated-through holes are larger in diameter than said void of first predetermined size and smaller in diameter than said voids of second predetermined size, a zero resistance measurement between said first of said test holes and a given one of said remaining test holes being indicative of a registration shift in the layer associated with the given test hole which is equal to the difference in the radii of said void of first predetermined size and the test plated-through hole, including the plating thickness.

4. A test arrangement as defined in claim 3 further including a second test coupon of identical characteristics to said one test coupon, the pair of last mentioned coupons being situated at diagonally opposite extremities of said board to provide a maximum distance therebetween and to effect a test for worst-case registration conditions.

5. A test arrangement as defined in claim 4 further including pluralities of additional test coupons, said one test coupon being included with a first plurality of said additional test coupons to provide a first set of test coupons situated along the periphery of one side of said board, said second test coupon being included with a second plurality of said additional test coupons to provide a second set of test coupons situated along the periphery of the opposite side of said board, the size of said first void in a subsurface layer in said first set of test coupons increasing progressively by a given amount from coupon to coupon in one direction across said board and reaching a predetermined maximum size in said one test coupon, the size of said first void in a subsurface layer in said second set of test coupons increasing progressively by said given amount from coupon to coupon in the opposite direction across said board and reaching said predetermined maximum size in said second test coupon, successive resistance measurements utilizing said first and said second set of coupons providing quantitative information as to the actual registration shift in any given subsurface layer of said board.

* * * * *